US006475695B2

(12) United States Patent
Kuroki et al.

(10) Patent No.: US 6,475,695 B2
(45) Date of Patent: Nov. 5, 2002

(54) INTERMEDIATE IMAGE RECEIVING SHEET FOR A THERMAL TRANSFER RECORDING METHOD

(75) Inventors: Takaaki Kuroki, Hino (JP); Tatsuichi Maehashi, Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 09/920,595

(22) Filed: Aug. 1, 2001

(65) Prior Publication Data

US 2002/0072007 A1 Jun. 13, 2002

(30) Foreign Application Priority Data

Aug. 7, 2000 (JP) ...................................... 2000-238359

(51) Int. Cl.[7] ........................... G03F 7/34; G03C 1/805; G03C 8/52

(52) U.S. Cl. ....................... 430/200; 430/201; 430/207; 430/256; 430/259; 430/262; 430/263

(58) Field of Search ................................ 430/200, 201, 430/207, 256, 259, 262, 263

(56) References Cited

U.S. PATENT DOCUMENTS

| | | | | | |
|---|---|---|---|---|---|
| 5,300,398 | A | * | 4/1994 | Kaszczuk | 430/200 |
| 5,580,693 | A | * | 12/1996 | Nakajima et al. | 430/200 |
| 5,607,809 | A | * | 3/1997 | Nakamura et al. | 430/200 |
| 5,759,738 | A | * | 6/1998 | Tsuno et al. | 430/200 |
| 5,821,028 | A | * | 10/1998 | Maejima et al. | 430/200 |
| 6,027,850 | A | * | 2/2000 | Kawakami et al. | 430/200 |
| 6,326,121 | B1 | * | 12/2001 | Takahashi | 430/200 |

* cited by examiner

*Primary Examiner*—Richard L. Schilling
(74) *Attorney, Agent, or Firm*—Bierman, Muserlian and Lucas

(57) ABSTRACT

Disclosed is provide an intermediate image receiving sheet for a laser thermal transfer recording method, which can easily transfer an image to even a rough surface paper with high quality and stable repeatablility, and can use a variety of papers to produce and image proof which yields results similar to a print made in a production run.

12 Claims, No Drawings

INTERMEDIATE IMAGE RECEIVING SHEET FOR A THERMAL TRANSFER RECORDING METHOD

FIELD OF THE INVENTION

The present invention relates to an intermediate image receiving sheet for a thermal transfer recording method. More specifically, the present invention relates to an intermediate image receiving sheet for a laser thermal image transfer recording method, which can easily transfer the image and yield a high quality transfer image without image defects, and is suitable for various kinds of paper, resulting in high quality proofs.

BACKGROUND OF THE INVENTION

In recent years, a need for direct digital color proofs (DDCP) has been raised particularly, in the field of printing in accordance with the spreading use of image forming technology employing digital data. In the DDCP process, laser thermal transfer technology is used to satisfy the requirements of high color reproducibility and stable repeatability.

The laser thermal transfer technology has already been disclosed. It is structured to use, (i) an ink sheet comprising a light-heat conversion layer and a ink layer containing a dye, (ii) an image receiving sheet comprising an ink receiving layer and a thermoplastic layer.

The ink layer face of (i) and the ink receiving layer face of (ii) are superposed, then imagewise exposed with a laser beam from the rear of the ink sheet. The ink layer is thermally transferred to the image receiving layer by a light-heat conversion effect, and then the image, transferred onto the receiving layer is further transferred onto a final image forming material.

The above-mentioned DDCP process enables printing out the final image on the same kind of paper used for a production run. The print produced with this process can be used as a final proof sample, due to the similarity to prints employing dot printing, the use of print ink pigments, and the use of the same kinds of paper used for a production run.

A variety of papers may be used for a production run such as art paper, coated paper, matt paper, fine coated paper, and uncoated paper. Recently, there has been an increasing demand to use the above-mentioned paper for the DDCP process.

However, when the softening ability or the fluidity of the thermoplastic layer in the image receiving sheet is enhanced under a heated condition in order to increase the transferring ability of the above-mentioned image receiving sheet onto matt paper or uncoated paper, the adhesiveness of the thermoplastic layer increases even at normal temperature. This results in an increase of the adhesion property between the paper and the image receiving sheet during the transferring process and the peeling process, causing problems such as tearing of the paper.

Because of the above-mentioned defect, the enhancement of the softening ability or the fluidity can not be considered the desired solution to achieve the preferred objective.

A composition for an image receiving sheet is disclosed in Japanese Patent Publishing Open to Public Inspection (JP-A) No. 9-52458. Said disclosed composition is: a support/a cushion layer/a releasing layer/and an image receiving layer. The thermoplastic property of the cushion layer and the stickiness of the image receiving layer is not directly related in this composition. Therefore, a variety of cushion layers can be chosen in this composition. One can even use a thermoplastic material in the cushion layer which has a tack property at normal temperature. However, the releasing layer prevents the cushion layer from closely contacting a rough surfaced paper. As a result, a satisfactory transfer property cannot be realized when this technology is applied to matt paper, uncoated paper such as fine-quality paper or medium-quality paper.

Another technology is disclosed in JP-A No. 2001-47753. When said technology was applied, it was found that the force required to peel the image receiving layer from the final image forming material was too high, and often resulted in damaging the surface thereof.

OBJECT OF THE INVENTION

The object of the present invention is to provide an intermediate image receiving sheet for a laser thermal transfer recording method, which can easily transfer an image to even a rough surface paper with high quality and stable repeatability, and can use a variety of papers to produce an image proof which yields results similar to a print made in a production run.

SUMMARY OF THE INVENTION

The object of this invention can be achieved by the following compositions.

1. An intermediate image receiving sheet, comprising:

(i) a support;

(ii) a thermoplastic layer which is capable of being thermally softened; and (iii) an image receiving layer which is capable of receiving an image from an image recording material; wherein the intermediate image receiving sheet is capable of transferring the image and the image receiving layer to a final image forming material by a process of applying heat or pressure to the intermediate image receiving sheet, and a force to peel the image receiving layer transferred to the final image recording material from a leaving portion on the support side is 1 to 100 g/cm, the force being measured with a material whose Bekk smoothness is 0 to 15 seconds at 25° C. and RH 50%, defined by JIS P8119

2. The intermediate image receiving sheet of item 1, wherein the force is 10 to 100 g/cm.

3. The intermediate image receiving sheet of item 2, wherein the force is 10 to 50 g/cm.

4. The intermediate image receiving sheet of item 1, wherein the intermediate image receiving sheet further comprises a releasing layer, which is capable of reducing the force and is provided between the thermoplastic layer and the image receiving layer, and the force to peel the image receiving layer transferred to the final image recording material from the releasing layer is 1 to 100 g/cm.

5. The intermediate image receiving sheet of item 4, wherein the releasing layer contains a binder resin in an amount of not less than 50% by weight of the releasing layer, and the binder resin in the releasing layer has a different SP value of 1 to 20 from that of a binder resin used in the image receiving layer.

6. The intermediate image receiving sheet of item 4, wherein the thermoplastic layer contains a binder resin in an amount of not less than 50% by weight of the thermoplastic layer, and the binder resin meeting the following requirements:

(i) a TMA softening point of 30 to 100° C., (ii) a melting point of 80 to 150° C., (iii) a difference between the melting point and the TMA softening point of less than 50° C.

7. The intermediate image receiving sheet of item 4, wherein the releasing layer contains a binder resin in an amount of not less than 50% by weight of the releasing layer, and having a TMA softening point of the binder resin of 120 to 300° C.

8. The intermediate image receiving sheet of item 4, wherein a thickness of the releasing layer is 0.3 to 6.0 μm.

9. The intermediate image receiving sheet of item 4, wherein a thickness of the image receiving layer is 0.1 to 3.0 μm.

10. The intermediate image receiving sheet of item 9, wherein a thickness of the image receiving layer is 0.2 to 2.5 μm.

11. The intermediate image receiving sheet of item 1, wherein the image receiving layer is placed on the thermoplastic layer which is placed on the support, and a force to peel the image receiving layer transferred to the final image recording material from the thermoplastic layer is 1 to 100 g/cm.

12. The intermediate image receiving sheet of item 11, wherein the thermoplastic layer contains a binder resin in an amount of not less than 50% by weight of the thermoplastic layer, and the binder resin meeting the following requirements:

(i) a TMA softening point of 30 to 100° C., (ii) a melting point of 80 to 150° C.

(iii) a difference between the melting point and the TMA softening point of less than 50° C.

13. The intermediate image receiving sheet of item 11, wherein a thickness of the image receiving layer is 0.5 to 10.0 μm.

14. The intermediate image receiving sheet of item 13, wherein a thickness of the image receiving layer is 0.8 to 8.0 μm.

15. The intermediate image receiving sheet of item 11, wherein the image receiving layer contains a butyral resin in an amount of not less than 50% by weight of the image receiving layer, and the thermoplastic layer contains a polyolefin resin in an amount of not less than 50% by weight of the thermoplastic layer.

Another compositions described below, can be used to achieve the object of the invention.

31. An intermediate image receiving sheet comprising (i) a support, (ii) a thermoplastic layer, and (iii) an image receiving layer, which is capable of receiving an image from an image recording material and transferring the image to a final image forming material, wherein, after being superposed on the final image forming material and upon application of heat or pressure, a force required to peel the image receiving layer from the support is between 1 and 100 g/cm, measured with the final image forming material whose Bekk smoothness, defined by JIS P8119, is 0–15 seconds.

32. The intermediate image receiving sheet of item 31 wherein the final image forming material, whose Bekk smoothness, defined by JIS P8119, is 0–15 seconds, is an NPI high quality paper having a weight of 127.9 g/cm (Nippon Paper Industries Co., Ltd.).

33. The intermediate image receiving sheet of item 31 or item 32, wherein the required force to peel the image receiving layer from the support and the thermoplastic layer is between 10 and 100 g/cm.

34. The intermediate image receiving sheet of items 31 to 33, wherein the thermoplastic layer is characterized by the following properties:

(i) a TMA (Thermomechanical Analysis) softening point of 30 –100° C., (ii) a melting point of 80–150° C.

(iii) a difference between the melting point and the TMA softening point of less than 50° C.

35. The intermediate image receiving sheet of items 31 to 34, wherein a releasing layer to reduce the peeling force is placed between the thermoplastic layer and the image receiving layer, and a major part of a resin in the releasing layer has a different SP value (Solubility parameter) of 1–20 from that of a resin used in the image forming layer.

36. The intermediate image receiving sheet of item 35, wherein the TMA softening point is 120–300° C.

DETAILED DESCRIPTION OF THE INVENTION

The present invention is detailed below.

(A) Intermediate Image Receiving Sheet (A-1) Support

The intermediate image receiving sheet of the present invention comprises at least a thermoplastic layer and an image receiving layer on a support, and after receiving an image, it can transfer said image to a final image forming material.

In order to closely contact the intermediate image receiving sheet onto an uneven surface of the final image forming material, it is necessary to set up a process to closely superpose face-to-face under a condition of high temperature and high pressure after forming an image on the intermediate image receiving sheet. The image transfer process may be carried out with heat or with pressure, and preferably with both heat and pressure.

The support used in the present invention can be selected without limitation from conventionally known supports. The thickness of the support is preferably 30–200 μm, and more preferably 50–125 μm.

Examples of usable support include plain paper, coated paper, synthetic paper such as propylene, polystyrene and a composite material prepared by pasting one of these onto paper, a plastic film or sheet such as a vinyl chloride resin sheet, an ABS resin sheet, a poly(ethylene terephthalate) film, a poly(butylene terephthalate) film, a poly(ethylene naphthalate) film, a polyallylate film, polycarbonate film, a poly(ether ketone) film, a polysulfone film, a poly(ether sulfone) film, a poly(ether imide) film, a polyimide film, a polyethylene film, a polypropylene film, a polystyrene film, an extended nylon film or a polyacetate film, as well as a multilayer plastic film or sheet, a film or sheet composed of metals, a film or sheet composed of ceramics, a plate of metal such as aluminum, stainless steel, chromium or nickel, paper coated with a resin or evaporation deposited with a thin metal layer. Of these, the poly(ethylene terephthalate) film and the polypropylene film are preferred, particularly preferred is a polypropylene film because of its high dimensional stability. The above-mentioned plastic supports which contain minute air-bubbles are also preferable, and, multilayer supports comprising both an air-bubble containing layer and a non air-bubble containing layer are also preferable.

Thermal shrinkage of supports is preferably 0.01 to 5% in both the lateral direction and the longitudinal direction, the measurement of which is describe in JIS C-2318. More preferably, it is 0.3–2% in the lateral direction and 1.2–2% in the longitudinal direction. Stretch strength of supports is preferably 5–30 kg/mm in the lateral direction and 10–35 kg/mm in the longitudinal direction. More preferably, it is 13–22 kg/mm in lateral direction and 15–22 kg/mm in longitudinal direction. The reason for selecting supports having these properties is to prevent wrinkling when transferring an image to the final image forming material.

A dimensional stabilizing treatment, an anti-static treatment, and other necessary treatments may be applied to the support of the present invention.

Said anti-static agents include a cationic, anionic or nonionic surfactant, a polymer anti-static agent, conductive fine particles and compounds described on pages 875 and 876 of "11290 Kagaku Shohin" (1290 Chemical Items), Kagakukogyo Nipposha. Other conventionally known surface modification treatments may be applied to the support.

An adhesion treatment can be conducted on to the support of the present invention.

Examples of such adhesion treatment include a flame treatment, a sulfuric acid treatment, a corona discharge treatment, and a plasma treatment. Pre-coating support with an adhesive is another option.

Among these, the corona discharge treatment is preferred. The strength of the corona treatment is preferably from 20 to 80 $W/m^2$, and more preferably from 30 to 70 $W/m^2$.

An adhesive layer can be coated on to the support of the present invention.

As the adhesive layer, any of the commonly known ones can be used without any limitation. The adhesive layer can be provided by a coating with a resin dissolved in an aqueous system, a resin dissolved in a solvent, an aqueous latex, or a hot-melt material.

Possible for the adhesive layer is; (1) selecting a material having a solubility parameter (SP) between that of the support an upper layer of the adhesive layer, (2) selecting a material which is reactive to the support and the upper layer, (3) selecting a material which has different adherence and sliding properties. One can choose an appropriate option according to circumstances.

Considering the cost and the consistency of the physical property, it is generally advantageous to load the adhesive layer at the same time of making the support. From this viewpoint, it is preferable to coat a latex selected from such as an acrylic resin, a polystyrene resin, a polyester resin, a polyurethane resin, or an ethylene-vinyl acetate copolymer. However, the usable latex for the support of this invention is not limited to the above-mentioned materials.

Various kinds of film equipped with an adhesive layer are commercially available from several companies and can be used for the present invention.

Examples of these are;

W-900E, W-900J, W-400J, T-100E, T-600E, S410E, S110G, T600G, H100C, H500, and H160L from MITSUBISHI POLYESTER FILM CORPORATION;

P60, Q80, Q81, Q82, Q83, Q27, P51, P52, P525, P025, S90, S91, S92, S94, S95, T90, T91, T94, T95, T98, T99, U94, U98, U99, X94 from Toray Industries, Inc.;

UL9, U51L74, U51LY, 535, 705, 505, 339, 330, and 534 from Teijin DuPont Films Corporation.

After receiving an image, it is important that one can easily discriminate the face-side and the back-side of the intermediate image receiving sheet of the invention. Because the face-side of the intermediate image receiving sheet has to be correctly placed onto the face-side of the final image forming material.

In order to satisfy the above-mentioned requirement, a white colored support having the following CIELAB chromaticity coordinates is preferred. L*: more than 80, a*: −10 to +10, b*: −10 to +10.

Moreover, in addition to the above-mentioned chromatic property of the support, the reflectance of the support plays an important role in the thermal transfer image recording method, employing a laser. When the reflectance of the support is over 20%, the exposure energy efficiency can be substantially increased, and as a result, the speed of the image transfer is also increased. Said reflectance is more preferably over 50%, and still more preferably, over 70%.

The advantage of the use of reflected light can be understood as follows.

In a preferably example of the present invention, an ink sheet comprising a light-heat conversion layer and a transfer ink layer is closely superposed on the intermediate image receiving sheet, then an image transfer is achieved by a laser scanning exposure. When the light coming through the light-heat conversion layer is reflected on the support of the intermediate image receiving sheet, it means that a weak energy is applied from the interface of the ink layer and the light-heat conversion layer. The energy applied in this method does not cause an ablation effect, which often occurs when a high intensity energy is produced in the interface of the support and the light-heat conversion layer of the ink sheet.

(A-2) Thermoplastic Layer

The thermoplastic layer is explained below. The intermediate image receiving sheet of the invention comprises at least one thermoplastic layer and an image receiving layer. In cases where the image receiving layer is provided on the thermoplastic layer without intervening the releasing layer between them, it is preferable that the force required to peel the thermoplastic layer from the image receiving layer be over 10 g/cm.

In addition, after transferring the image to the final image forming material, the force required to peel the image receiving layer from the thermoplastic layer, to yield the final image on the final image forming material is 1–100 g/cm, is preferably 2–100 g/cm, is more preferably 3–100 g/cm, is still more preferably 10–100 g/cm, and is most preferably 10–50 g/cm. when measured under the condition of 25 ° C. and RH 50%, after transferred to the final image forming material whose Bekk smoothness, defined by JIS P8119, is 0–15 seconds, or more preferably with N Silver-Daia paper having a weight of 127.9 $g/m^2$ (Nippon Paper Industries Co., Ltd.: Kanto area), or NPI high grade paper having a weight of 127.9 $g/m^2$ (Nippon Paper Industries Co., Ltd.). The intermediate image receiving sheet of the present invention is required to have the property of closely contacting the uneven surface of a final image forming material. To fully realize this requirement, the thermoplastic layer is required to show a high fluidity under high temperature or high pressure.

The maximum thickness of the thermoplastic layer is preferably less than 100 $\mu$m, and more preferably it is less than 50 $\mu$m. When the thickness of the thermoplastic layer is more than 100 $\mu$m, it is difficult to dry the thermoplastic layer and is unpractical to make it.

The above-mentioned requirements for the thermoplastic layer can be fulfilled by one of the following means:

(1) selecting a single material having an appropriate SP value and thermo-physical property.

(2) selecting a resin having an appropriate surface lubricant and exhibiting the desired thermal fluidity by an addition of an appropriate additive.

(3) exhibiting the desired surface lubricity through a combination of resins, which have an appropriate thermal property, and an additive.

The thermoplastic layer of the present invention preferable shows no fluidity at normal temperature, and preferable shows marked fluidity at a high temperature beyond its softening point. The preferred softening point of the thermoplastic layer is 30–100° C., measured with TMA (Thermomechanical Analysis), and more preferred is 40–80° C. In addition to the softening property, the thermoplastic layer is preferred to have a melting point of 80–150° C., as defined by the method reported in the Japanese Patent Application No. 11-243093.

Particularly, the difference between the melting point and TMA softening point is preferred to be less than 50° C., and is still more preferred to be less than 40° C.

The thermoplastic layer is preferably contains a binder resin whose weight ratio is more than 50% of the thermoplastic layer, and more preferably more than 70%.

Although the preferable properties of the thermoplastic layer according to the invention is not always limited by the kind of material, examples of the material having a preferable property include:

polyolefin resins such as a polyethylene, a polypropylene, an ethylene-vinyl acetate copolymer, ethylene-ethylene acrylate copolymer; a polyvinyl chloride, a vinyl chloride-vinyl acetate copolymer, a vinyl chloride-vinyl alcohol copolymer, a vinyl acetate-maleic acid copolymer, a polyvinylidene chloride; synthetic rubbers such as a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), a butyl rubber; a chlorinated rubber, an acrylate copolymer, a polyester resin, a polyurethane resin, an acryl resin, and a polynorbornene.

Of these, examples of preferred materials are a polyolefin resin such as a polyethylene, a polypropylene, an ethylene-vinyl acetate copolymer, or an ethylene-ethylene acrylate copolymer; a polyvinyl chloride, a vinyl chloride-vinyl acetate copolymer, a vinyl chloride-vinyl alcohol copolymer, and a vinyl acetate-maleic acid copolymer.

The preference for a polyolefin resin can be explained as follows. The polarity of a polyolefin resin is very small, and as a result, the polarity difference from the polarity of an acrylic resin, a styrene resin, and a polyester resin, which has usually a good transferring property to paper, is large. This large difference allows to decrease the force to peel the intermediate image receiving sheet from the final image forming material, which is very advantageous.

A vinyl chloride copolymer has practically no adhesiveness at normal temperature, and its elastic modulus is relatively small. These properties enable close contact to the transfer image to an uneven surface of the support at the moment of thermal transfer. Moreover, there are many kinds of available plasticizers, and it is easy to control the elastic modulus. In addition, the control of the contact force between the layers can be easily achieved by the effect of a hydroxy group or a carboxyl group present in the copolymer. One can add a reagent, which can improve close contact between the support and the final image forming layer, a surface active reagent, or a surface lubricant in the above-mentioned organic polymers. The use of an adhesive polymer is also effective to decrease the elastic modulus, if it is used within the limit of an increase of adhesiveness at normal temperature.

Of these, a polymer of relatively low molecular weight likely satisfies the requirements of the invention. However, one cannot make a restriction in consideration of the nature of the material. The thermoplastic layer can be loaded with a solvent coating, and it can be also coated with an aqueous coating employing an aqueous dispersion such as a latex or an emulsion. Moreover, a water miscible resin can be used. These resins can be use singly or by mixing with each other according to need.

A way to achieve a desirable property is to select a single material having an appropriate SP value and a thermophysical property. A preferable resin appropriate for said transfer is a resin whose polarity is very different from that of a resin such as an acrylic resin, a styrene resin, or a polyester resin.

Examples of a resin, which is a powerful surface lubricant, include a polyolefin resin such as an ethylene-vinyl acetate copolymer, an ethylene-ethylene acrylate copolymer, a polyvinyl chloride, a vinyl chloride-vinyl acetate copolymer, a polyvinylidene chloride, a polyfluoroethylene, a silicone-modified acrylic resin, a silicone-modified polyester, a silicone rubber, a fluorinated Rubber, and any of the conventionally known water. soluble resins.

Said water soluble resins disclosed in Japanese Patent Publishing Open to Public Inspection (JP-A) No. 10-259431 can be preferably used in the present invention.

One way to achieve a desirable property is to select a resin having an appropriate surface lubricant and to give a desired thermal fluidity by an addition of an appropriate additive. Examples of such additives include a low melting point material such as a wax, a plasticizer, a thermal solvent and a tackifier. Examples of such waxes include a vegetable waxes such as carnauba wax, Japan wax, ouricury wax, or esparto wax, animal waxes such as bees wax, insect wax, shellac wax, or spermaceti wax, petroleum waxes such as paraffin wax, microcrystalline wax, polyethylene wax, ester wax, or acid wax, and mineral waxes such as montan wax, ozocerite or ceresine. In addition to these waxes, the additives further include a higher fatty acid such as palmitic acid, stearic acid, margaric acid, or behenic acid, higher alcohosl such as palmityl alcohol, stearyl alcohol, behenyl alcohol, margaryl alcohol, myricyl alcohol, or eicosanol, higher fatty acid esters such as cetyl palmitate, myricyl palmitate, cetyl stearate or myricyl stearate, amides such as acetoamide, propionic amide, palmitic amide, stearic amide, or an amide wax, and higher amines such as stearyl amine, behenyl amine or palmityl amine.

Of these, those being a solid state at ordinary temperature are preferable, and those having a melting point of from 40 to 130° C. are more preferable, and those having a melting point of from 70 to 110° C. are still more preferable.

Examples of plasticizers, heat solvents and tackifiers include a phthalic ester, an adipic ester, a glycol ester, a fatty acid ester, a phosphoric acid ester and a chlorinated paraffin. Various additives, for example, described in "Practical Hand Book of Additives for Plastics and Rubber" Kagaku Kogyosha, 1960, can be added.

Another way to achieve a desirable property is to give a desired surface lubricity through an appropriate design of a thermal property of resins and an additive.

Examples of resins which have the desirable thermal properties include polyolefin resins such as an ethylene-vinyl acetate copolymer or an ethylene-ethylene acrylate copolymer, a polyvinyl chloride, a vinyl chloride-vinyl acetate copolymer, a polyvinylidene chloride, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), a butyl rubber, a chlorinated rubber, an acrylate copolymer, a polyester resin, a polyurethane resin, an acrylic resin, and a polynorbornene.

Desirable properties can be bestowed onto the resin by addition of various kinds of additives. Examples of such additives include different kinds of surface active agents, a surface lubricant such as a silicon oil, a fluorinated resin, or a silicon resin.

Said thermoplastic layer can be formed by providing the materials dissolved in a solvent or dispersed in a latex by means of a blade coater, a roller coater, a bar coater, a curtain coater, a gravure coater, or by extruding lamination of hot-melt materials.

A special thermoplastic layer exhibiting voids produced by a foamed thermoplastic resin can also be used.

The thickness of the thermoplastic layer is preferably not less than 5 μm, and more preferably not less than 10 μm. When the thickness of the lower layer is less than 5 μm, it tends to occur in a lack of the image at the time of the image retransfer to the final image forming material.

(A-3) Image Receiving Layer

The image receiving layer of the present invention is detailed below.

The image receiving layer of the present invention comprises a binder and various additives which are added as necessary. The binder is preferably a thermoplastic resin whose softening point, measured by TMA measurement, is not more than 100° C., however the softening point is more preferably not more than 80° C.

Examples of the binder used in the image receiving layer include adhesives such as a polyvinyl acetate emulsion type adhesive, a chloroprene type adhesive or an epoxy resin type adhesive; tacking agents such as a natural rubber type, a chloroprene rubber type, a butyl rubber type, a polyacrylate type, a nitrile rubber type, a polysulfide type, a silicone rubber type or a reclaimed rubber; a petroleum type resin, SBR, a polybutadiene resin, a polyisoprene, a polyvinyl ether, an ionomer resin, SIS, SEBS, an acrylic resin, an ethylene copolymer, an ethylene-vinyl chloride copolymer, an ethylene-acrylic copolymer, an ethylene-vinyl acetate (EVA) resin, a vinyl chloride grafted EVA resin, an EVA grafted vinyl chloride resin, a polyvinyl chloride resin, or a vinyl chloride copolymer such as a vinyl chloride-vinyl acetate copolymer; a polyvinylidene chloride, a vinylidene chloride copolymer, a polystyrene, a styrene copolymer such as a styrene-acrylic copolymer or a styrene-maleic ester copolymer, a vinyl acetate copolymer, an polyurethane resin, a polyester resin, a polyolefin resin, variously modified polyolefins, and a polyvinylbutyral, a phenolic resin, a urea resin, a melamine resin, an alkyd resin, a maleic resin, a hydroxystyrene copolymer, a sulfonamide resin, a cellulose resin, a nylon resin, or a polyvinylformal resin.

In cases where the image receiving layer is provided on the thermoplastic layer without intervening the releasing layer, one of the preferred compositions is to use a butyral resin as a binder resin, and to use a polyoleine resin such as a polyethylene resin as a binder resin for the thermoplastic layer.

Of these, preferred binders include polyolefins such as a polyethylene and a polypropylene, ethylene copolymers such as an EVA and an ethylene-acrylic copolymer, a polyvinyl chloride, a vinyl chloride copolymer such as a vinyl chloride-vinyl acetate copolymer, a polyvinylidene chloride, a vinylidene chloride copolymer, a polystyrene, a styrene copolymer such as a styrene-acrylic copolymer and styrene-maleic ester copolymer, and a vinyl acetate copolymer.

The above-mentioned resins may be used singly or by mixing with each other.

The image receiving layer preferably contains a matting agent. Materials that can be used for a backing agent, which will be described later, can also be used for said matting agent.

The average size of the matting agent is preferably larger by 0.3 to 10.0 μm, more preferably by 0.3 to 8.0 μm, particularly preferably by 1.0 to 5.5 μm, than the average thickness of the layer containing no matting agent.

The effects of the matting agent on the gas removing and the fogging are decreased when the above-mentioned value of the matting agent is less than 0.3 μm, and the sensitivity is lowered when the that value exceeds 10.0 μm. It is preferable that said matting agent has a size distribution in which the weight of the particles having a diameter more than 2 times that of the average diameter is not more than 20%, more preferably 5%.

Deterioration during storage, such as blocking, can be inhibited by the use of said matting agent in which the weight of the particles having a diameter more than 2 times of the average diameter is not more than 20% since the pressure is more uniformly mitigated. The use of said matting agent in which the weight of the particles having a diameter more than 2 times of the average diameter is not more than 5% is more preferable from the viewpoint of storage stability.

When such matting agent is selected, the thickness of the image receiving layer is preferably not more than 3.0 μm since the image tends to be yellowish due to the presence of excessive amount of the matting agent when the thickness is more than 3.0 μm, and the matting agent is added so that the amount of the matting agent is appropriate to the thickness of the layer. The thickness of the image receiving layer is preferably 0.8 to 3.0 μm. When the releasing layer is provided, the preferred thickness of the receiving layer is 0.1 to 3 μm, and more preferably 0.2 to 2.5 μm. Furthermore, when the releasing layer is not provided, the preferred thickness of the receiving layer is 0.5 to 10 μm, and more preferably 0.8 to 8 μm.

The distribution of the matting agent at the surface of the image receiving layer is also important, and the number of said matting agent particles at the surface of the receiving layer is preferably within the range of $200/mm^2$ to $2400/mm^2$. The effect of the matting agent is enhanced when the particles of the matting agent have a regular spherical shape. Said regular spherical shape in the invention means that the shape of the particles, by microscopic observation, is approximate sphere and the difference between the major and the minor diameters is about 20% or less.

The coating weight of the matting agent in the image receiving layer is preferably 0.6 to 4.0 $g/m^2$, and more preferably, 1.0 to 3.0 $g/m^2$.

(A-4) Releasing Layer

In the intermediate image receiving sheet of the present invention, a releasing layer may be provided between the image receiving layer and the thermoplastic layer. In this formation, it is required that the peeling force between the releasing layer and the image receiving layer should be more than 10 g/cm. And after transferring an image onto a final image forming material, whose Bekk smoothness defined by JIS is 0–15 seconds, the required force to peel the image receiving layer from the under layer of the receiving layer, preferably from the releasing layer, of the intermediate image receiving is between 1 and 100 g/cm, measured at 25° C. and RH 50%. Preferably, the required force to peel the image receiving layer from the under layer of the image receiving layer is 2 to 100 g/cm, is more preferably 3–100 g/cm, is still more preferably 10–100 g/cm, and is most preferably 10–50 g/cm.

In said releasing layer, it is preferred to use a major component resin whose SP (solubility parameter) value is different by more than 1 unit from that of a resin used for the image receiving layer. When the difference of said SP value is 2 to 20, the releasing ability increases, which is preferable.

A major component means a weight ratio of more than 50%, and more preferably more than 70%.

Providing said releasing layer is the preferred formation. When a matting agent is used in an image receiving layer or in a back coating layer, it sometimes results in a property change due to an embossing effect caused by the pressure of the matting agent in the image receiving layer or during storage. The releasing layer can reduce the property change. The releasing layer can facilitate the image release on the final image forming material, and makes it easier to use various kinds of paper.

Selection of the binder for the releasing layer should be done by considering the property appropriate to the image receiving layer.

It is preferred to use a main component resin whose SP (solubility parameter) value is different by more than 1 unit from that of a resin used for the image receiving layer.

The SP value indicates the solubility parameter, and is defined by the following formula:

$$SP=(\Delta E/V)^{1/2}$$

ΔE: evaporation energy

V: molar volume

Because ΔE/V is the density of cohesive energy, the SP value is related to the cohesive energy of the material. The SP value in the present invention was determined with the method described in "Setchaku, Volume 40, No. 8, (436$^{th}$ issue), pages 6–14, Kobunshikankokai".

The material for the releasing layer, which is selected by considering the appropriateness for the image receiving layer, includes polyester, polyvinyl acetal, polyvinyl formal, polyparabanic acid, polymethylmethacrylate, polycarbonate, ethylcellulose, nitrocellulose, methylcellulose, carboxymethylcellulose, hydroxypropylcellulose, polyvinyl alcohol, polyvinyl chloride, polystyrene, acrylonitrile styrene or their cross-linked polymers, a thermosetting resin having a Tg of 65° C. or more such as polyamide, polyimide, polyetherimide, polysulfone, polyethersulfone or aramid or their hardened resin. The cross-linking agent includes conventional ones such as isocyanate or melamine.

A thermoplastic resin which is modified by silicone or fluorine, which increases the releasing ability, is also a preferable option.

The TMA softening point of the resin used in the releasing layer is preferably 120 to 300° C. is more preferably 140 to 300° C.

The thickness of the releasing layer is preferably 0.3 to 3.0 μm. When the releasing layer is too thick, the property as a cushioning layer is difficult to develop, and the thickness needs to be adjusted according to kind of the releasing layer.

(A-5) Back Coating Layer

A back coating layer may be provided on the reverse side, being opposite to the side on which the image receiving layer is provided, in order to provide functions such as running stability, heat resistivity and an antistatic property.

Providing said back coating layer is also effective to reduce image defects and to assure image quality consistency.

Said back coating layer can be formed with a back coating solution, which is prepared by dissolving a binder resin into a solvent, or emulsifying or dissolving a binder resin in a solvent with a matting agent having an average particle diameter of 2 to 30 μm.

The binder used in the back coating layer includes conventionally known polymers such as gelatin, polyvinyl alcohol, methylcellulose, nitrocellulose, acetylcellulose, an aromatic polyimide resin, a silicone resin, an epoxy resin, an alkyd resin, a phenol resin, a melamine resin, a fluorine-containing resin, a polyimide resin, a urethane resin, an acryl resin, a urethane modified silicone resin, a polyethylene resin, a polypropylene resin, a polyester resin, a Teflon resin, a polyvinyl butyral resin, a polyvinyl chloride resin, polyvinyl acetate, polycarbonate, an organic boron compound, an aromatic ester, a fluorinated polyurethane, and a polyether sulfone.

Using a cross-linkable aqueous binder in the back coating layer, and cross-linking said binder, is effective to prevent the separation of the matting agent from the back coating layer and also improve the scratch resistance of the back coating layer. It is also effective to minimizing blocking during storage.

According to the characteristics of employed cross-linking agent, said cross-linking may be carried out by heat, an actinic light, pressure or combinations of these, but with no specific limitations. An adhesive layer may also be provided on the back coating layer side of the support to provide an adhesion property to said support.

The abrasive resistance of the back coating layer is preferably more than 10 g, and more preferably more than 20 g, measured with a 0.1 mm R scratch test apparatus.

The surface roughness Ra can be measured with an apparatus RST/PLUS made by WYCO Co., Ltd.

The matting agent preferably used in the back coating layer includes organic or inorganic fine particles. The organic matting agent includes fine particles such as polymethyl methacrylate (PMMA), polystyrene, polyethylene, polypropylene or other radical polymerization polymers, as well as polycondensation polymer fine particles such as polyester and polycarbonate. Cross-linked organic fine particles are preferably used in order to increase the strength of the particles against the external force and the solvent.

The coating amount of the back coating layer is preferably 0.5 to 5 g/m$^2$. A coating amount less than 0.5 g/m$^2$ results in unstable coatability and separation of the matting agent from the back coating layer. Since a coating amount greater than 5 g/m$^2$ requires a matting agent of large particles, resulting in an image receiving layer which is likely to be embossed by the back coating layer during storage. And specifically, image transfer failure or image unevenness is likely to occur in a thin layer heat fusion transfer recording method, comprising transfer recording of a thin colorant layer.

The number average particle size of the matting agent is preferably 1 to 20 μm greater than the thickness of the back coating layer containing only a binder resin.

The matting agent having the particle size of 2 μm or more is required to exist at least in an amount of 5 mg/m$^2$ in the back coating layer, more preferably, in an amount of 6 to 600 mg/m$^2$. It minimizes foreign matter problems.

It has been proven that the matting agent having a value obtained by dividing standard deviation by the number average particle size, $\sigma/r_n$ (variation coefficient of particle size) of 0.3 or less, which has a narrow particle size distribution, solves the problem which occurs caused by a matting agent of excessively large particles and further, can attain the intended object by only in a small amount. The variation coefficient is more preferably 0.15 or less.

The surface Ra of the back coating layer is preferably 30 nm to 5 μm, is more preferably 50 nm to 4 μm, and is still more preferably 80 nm to 3 μm.

The measurement of Ra was done for a sample left one day keeping at 20° C. in 50% RH. A scratch resistance measuring apparatus HEIDON-18 (made by HEIDON Co., Ltd) was used with a sapphire needle of 0.1 mmR. The measurement was done three times using the same loading weight and scratching 10 cm long. The limiting weight which showed no scratch in the surface of the support was defined as a scratch resistance of the present invention.

The back coating layer preferably contains an antistatic agent in order to prevent foreign matter adherence due to triboelectrification caused by contact with the transport rollers.

Said anti-static agents include a cationic, anionic or nonionic surfactant, a polymer anti-static agent, conductive fine particles and compounds described on pages 875 and 876 of "11290 Kagaku Shohin", Kagakukogyo Nipposha.

Said antistatic agent preferably used in the back coating includes conductive fine particles such as carbon black and graphite, metal oxides such as tin oxide, zinc oxide, or titanium oxide, and organic semiconductors. Specifically, the conductive fine particles will not separate from the back coating layer and give a stable antistatic effect, independent of any ambient atmosphere changes.

The back coating layer may contain various surfactants, silicone oils or releasing agents such as a fluorine-containing resin, in order to provide a good releasing or coating property.

The addition of a releasing material in the back coating layer is preferred, especially when the softening point, measure with TMA, of the cushion layer and the image receiving layer is less than 70° C.

Said TMA softening point is measured by loading a constant weight to a sample and increasing the temperature at a constant rate. The softening point is determined by observing the phase change of the target sample.

The TMA softening point in the present invention is defined as the starting point of said phase change.

The measurement of the TMA softening point is achieved, for example, with Thermoflex (Rigaku Corporation).

The measuring conditions are as follows. The measuring range of the temperature is set to be 25 to 200° C. at a temperature increasing rate of 5° C./min, with a weight load of 10 g on a quartz pin. The observed starting point of the phase change is defined as the TMA softening point.

A preferred example of the present invention is to use a back coating layer comprising an auto-film forming polymer latex emulsified in water, a conductive material, and a matting agent. A further advantage of a polymer latex having a cross linking group promotes an increase in film strength.

(B) Ink Sheet

The ink sheet of the present invention is a film having an ink transferring property and a light-heat conversion capability.

The ink sheet of the present invention comprises at least a support having thereon an ink layer and a light-heat conversion layer. It is possible to provide these two properties in one layer. Moreover, a cushion layer, or a releasing layer can be provided between the support and the above-mentioned layers as desired.

Further, a back coating layer can be provided on the opposite side of the support according to need.

(B-1) Support of the Ink Sheet

Any materials can be used as the support of the ink sheet as long as said materials have suitable dimensional stability and sufficient resistivity to heat at the time of image formation.

Examples of usable supports include plain paper, coated paper, synthetic paper such as propylene, polystyrene and a composite material prepared by pasting one of these onto paper, a plastic film or sheet such as a vinyl chloride resin sheet, an ABS resin sheet, a poly(ethylene terephthalate) film, a poly(butylene terephthalate) film, a poly(ethylene naphthalate) film, a polyallylate film, a polycarbonate film, a poly(ether ketone) film, a polysulfone film, a poly(ether sulfone) film, a poly(ether imide) film, a polyimide film, a polyethylene film, a polypropylene film, a polystyrene film, an extended nylon film or a polyacetate film, as well as multilayer plastic film or sheet, a film or sheet composed of metals, a film or sheet composed of ceramics, a plate of metals such as aluminum, stainless steel, chromium or nickel, paper coated with a resin and evaporated with a metal thin layer.

A dimensional stabilizing treatment, an anti-static treatment, and other optimal treatments may also be applied to the support of the present invention.

The anti-static agent includes a cationic, anionic or nonionic surfactant, a polymer anti-static agent, conductive fine particles and compounds described on pages 875 and 876 of "111290 Kagaku Shohin" (1290 Chemical Items), Kagakukogyo Nipposha.

Other conventionally known surface modification treatments can be applied to the support.

Examples of such surface modification treatments include a flame treatment, a sulfuric acid treatment, a corona discharge treatment, and a plasma treatment.

In order to achieve a satisfactory coating of the after-mentioned layers, an adhesive layer can also be provided on the support.

As the adhesive layer, commonly known ones can be used without any specific limitation. Said adhesive layer can be provided by coating a resin dissolved in an aqueous system, a resin dissolved in a solvent, an aqueous latex or a hot-melt material.

Considering the cost and the consistency of the physical property, it is generally advantageous to load the adhesive layer at the same time of making the support. From this viewpoint, it is preferable to coat a latex selected from compounds such as acrylic resin, polystyrene resin, polyester resin, polyurethane resin, and ethylene-vinyl acetate copolymer. However, the usable latex for the support of this invention is not limited to the above-mentioned materials.

Various kinds of films equipped with an adhesive layer are commercially available from several companies and may be used for the present invention.

The support of the recording material is preferably transparent to facilitate image formation by exposure to laser light from the recording material side. In order to assure easier superposition, the support of the recording material is preferably thinner than the intermediate image receiving sheet.

The thickness of the support of the recording material is preferably 30 to 150 $\mu$m, and more preferably 50 to 100 $\mu$m.

(B-2) Back Coating Layer

The binder used in the back coating layer of the ink sheet includes any conventionally known polymers such as gelatin, polyvinyl alcohol, methylcellulose, nitrocellulose, acetylcellulose, aromatic polyimide resin, silicone resin, epoxy resin, alkyd resin, phenol resin, melamine resin, fluorine-containing resin, polyimide resin, urethane resin, acryl resin, urethane modified silicone resin, polyethylene resin, apolypropylene resin, polyester resin, Teflon resin, polyvinyl butyral resin, polyvinyl chloride resin, polyvinyl acetate, polycarbonate, organic boron compound, aromatic ester, fluorinated polyurethane, and polyether sulfone.

Using a cross-linkable aqueous binder in the back coating layer and cross-linking said binder is effective in preventing the separation of the matting agent from the back coating layer or to improve anti-scratch property of the back coating layer. It is also effective in preventing blocking during storage.

According to the characteristics of the cross-linking agent used, said cross-linking is carried out by heat, an actinic light, pressure or combinations of these, but with no specific limitations. An adhesive layer may also be provided on the back coating layer side of the support to give an adhesion property to the support.

It is preferable to include a matting agent in said back coating layer of the ink sheet.

The matting agent preferably used in the back coating layer includes organic or inorganic fine particles. Said organic matting agent includes fine particles such as polymethyl methacrylate (PMMA), polystyrene, polyethylene, polypropylene or other radical polymerization polymers and fine polycondensation polymer particles such as polyester and polycarbonate.

The coating amount of the back coating layer is preferably 0.5 to 5.0 g/$m^2$. A coating amount less than 0.5 g/$m^2$ results in unstable coatability and separation of the matting agent from the back coating layer. Since a coating amount more than 5.0 g/$m^2$ requires a matting agent of relatively large particles, and the image receiving layer is likely to be embossed by the back coating layer during storage, and particularly, image transfer failure or image unevenness is likely to occur with a thin layer heat fusion transfer recording method comprising transfer recording of a thin colorant layer.

The number average particle size of the matting agent is preferably 1 to 20 $\mu$m greater than the thickness of a back coating layer containing only a binder resin.

The back coating layer containing a matting agent having a particle size of 2 $\mu$m or more in an amount of 5.0 mg/$m^2$ minimizes foreign matter problems. More preferably, the amount is between 2 to 600 mg/$m^2$.

It has been proven that a matting agent exhibiting a value obtained by dividing a standard deviation by the number average particle size, $\sigma/r_n$ (being the variation coefficient of the particle size) of 0.3 or less, which has a narrow particle size distribution, solves the problem which is caused by a matting agent of excessively large particles and further, can attain the intended objective in a small amount. The variation coefficient is more preferably 0.15 or less.

The back coating layer preferably contains an antistatic agent in order to prevent foreign matter adherence due to triboelectrification caused by contact with the transport rollers.

The anti-static agent includes a cationic, anionic or nonionic surfactant, a polymer anti-static agent, conductive fine particles and compounds described on pages 875 and 876 of "11290 Kagaku Shohin", Kagakukogyo Nipposha.

The antistatic agent preferably used in the back coating includes conductive fine particles such as carbon black and graphite, metal oxides such as tin oxide, zinc oxide, or titanium oxide, and organic semiconductors. Specifically, the conductive fine particles will not separate from the back coating layer and give a stable antistatic effect, independent of any ambient atmosphere changes.

The back coating layer may contain various surfactants, silicone oil or a releasing agent such as a fluorine-containing resin in order to provide a releasing or coating property.

The addition of a releasing material in the back coating layer is preferred, especially when the softening point of the cushion layer and the image receiving layer, measure with a TMA, is less than 70° C.

(B-3) Cushion Layer

In order to increase adhesiveness between the ink sheet and the intermediate image receiving sheet during exposure to light, it is preferred to provide a cushion layer between the support and the light-heat conversion layer of the ink sheet, or to employ a support having a cushioning property.

The cushion layer is preferably provided to improve to bring the ink sheet (the recording medium) into closer contact with the intermediate image receiving sheet.

Said cushion layer is a layer having a thermoplastic property or an elastic property. A material which can be sufficiently softened by heating or a material having a low elasticity or a gum elasticity can be used.

Said cushion layer is a layer having a cushioning property. Elastic modulus or penetration can be employed as a measure of the cushioning property referred to herein. The cushion layer having, for example, an elastic modulus of 1 to 250 kg/$mm^2$ or a penetration of 15 to 500, preferably 30 to 300, exhibits an excellent cushioning property when forming a color image proof. But the desired cushion degree may be varied according to the intended use of the image. The material for the cushion layer may be selected at one's discretion.

The penetration herein referred to is determined according to JIS K2530-1976.

Although the preferable properties of the cushion layer of the present invention are not always determined by the kind of material, examples of the material having a preferable property include:

a polyolefin resin, an ethylene-vinyl acetate copolymer, a ethylene-ethylene acrylate copolymer, an ethylene-ethyl acrylate copolymer, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylate copolymer, a polyester resin, a polyurethane resin, an acrylic resin, a butyl rubber and a polynorbornene.

Of these, a polymer of relatively lower molecular weight is more likely to satisfy the requirements of the invention. However, a restriction in consideration of the nature of the material should not be made. The cushion layer can be caoted with a solvent coating, and it may also be coated with an aqueous coating employing an aqueous dispersion such as a latex or an emulsion. Alternatively, a water miscible resin can be used. These resins may be use singly or by mixing with each other according to need.

Additives other than the ones described above may also provide preferable properties to the cushion layer. These additives include a low melting point compound such as wax and plasticizers such as phthalate, adipate, glycol ester, fatty acid ester, phosphate, and chlorinated paraffin. Additives described in "Purasuchikku oyobi gomu yo tenkazai jitsuyo binran", Kagaku Kogyosha (1970) may be used.

The amount of said additives may be any amount necessary to develop preferable properties in the main components used in the cushion layer with no specific limitations, but is preferably 10 weight %, and more preferably 5 weight %, based on the total cushion layer weight.

Said cushion layer can be formed by providing the materials dissolved in a solvent or dispersed in a latex by means of a blade coater, a roller coater, a bar coater, a curtain coater, a gravure coater, or by extruding a lamination of hot-melt materials.

A special resin layer featuring voids, produced by a foamed thermoplastic resin, may also be used.

The thickness of said thermoplastic layer is preferably 0.5 to 10.0 μm, and more preferably 1.0 to 7.0 μm.

(B-4) Light-Heat Conversion Layer

A light-heat conversion layer is a layer which converts incident light to heat.

When a light-heat conversion agent is added to the ink layer, a light-heat conversion layer is not required. When the light-heat conversion agent is not transparent, the light-heat conversion layer is preferably provided separately from the colorant layer, in view of color reproduction of a transferred image. The light-heat conversion layer should be provided closest to the colorant layer.

As a binder of the light-heat conversion layer, used may be resins having high Tg and high heat conductivity. Said binder includes conventionally known heat-resistant resins such as polymethylmethacrylate, polycarbonate, polystyrene, ethylcellulose, nitrocellulose, polyvinylalcohol, polyvinyl chloride, polyamide, polyimide, polyetherimide, polysulfone, polyethersulfone, and aramide. Other resins such as polythiophene, polyaniline, polyacetylene, polyphenylene sulfide, polypyrrole, derivative polymers of these polymers, and a mixture of these polymers can also be used.

A water soluble polymer is also viable in the light-heat converting layer. Said water soluble polymer is preferable because it gives excellent peelability between the colorant layer and the light-heat converting layer, and has high heat resistance during light irradiation, restrains scattering or ablation of the light-heat converting layer after excessive heat is applied. When said water soluble polymer is used, it is preferable that the light-heat converting compound is water soluble (by incorporation of a sulfo group to the compound) or dispersed in water. The addition of a releasing agent to the light-heat converting layer can give excellent peelability between the colorant layer and the light-heat converting layer and can improve sensitivity. The releasing agent includes a silicone releasing agent (for example, a polyoxyalkylene modified silicone oil or an alcohol modified silicone oil), a fluorine-containing surfactant (for example, a perfluoro phosphate surfactant), and various other surfactants.

Said light-to-heat converting compound is preferably a compound which absorbs light and effectively converts it to heat, although differently due to the light source used. For example, when a semi-conductor laser is used as a light source, a compound having absorption in the near-infrared light region is required. The near-infrared light absorbing compounds includes an inorganic compound such as carbon black, an organic compound such as a cyanine, polymethine, azulenium, squalenium, thiopyrylium, naphthoquinone or anthraquinone dye, and an inorganic metal complex of phthalocyanine, azo or thioamide. Specifically, the near-infrared light absorbent includes compounds disclosed in JP-A Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds can be used singly or in combination of two or more kinds thereof.

The thickness of the light-heat conversion layer is preferably 0.1 to 3.0 μm, and is more preferably 0.2 to 1.0 μm. The content of said light-heat converting compound in the light-heat conversion layer may ordinarily be determined in such a manner that the layer provides an optical density of preferably 0.3 to 3.0, more preferably 0.7 to 2.5 to light wavelengths emitted from the used light source.

When carbon black is used in the light-heat conversion layer and the thickness of said light-heat conversion layer is more than 1 μm, scorching due to excessive heating seldom occurs but the sensitivity of the ink sheet tends to be lowered. However, the thickness of the light-heat conversion layer can be optionally selected by considering the power of the laser used or the absorbance of the light-heat conversion layer.

As the light-heat converting layer, an evaporated layer may be used. The evaporated layer includes an evaporated layer of carbon black or metal black such as gold, silver, aluminum, chrome, nickel, antimony, tellurium, bismuth, or selenium described in JP-A No. 52-20842.

Other evaporated layers of a metal element of Ib, IIb, IIIa, IVb, Va, Vb, Via, VIb, VIIb and VIII groups in the periodic table or an alloy thereof, and particularly preferable metal includes Al, Bi, Sn, In, Zn or an alloy of these, or an alloy of these metal and an element of Ia, IIa, and IIIb groups in the periodic table. Suitable metal oxide and metal sulfide include compounds of Al, Bi, Sn, In, Zn, Ti, Cr, Mo, W, Co, Ir, Ni, Pb, Pt, Cu, Ag, Au, Zr and Te, or mixture of these. Further, evaporated layers of metallophthalocyanine compounds, metallodithiolene compounds and anthraquinone compounds are cited.

The thickness of the evaporated layer is preferable less than 500 Angstrom.

The light-heat conversion compound may be a colorant itself in the ink layer. As the light-heat converting compound, various other compounds may be used, and are not limited to the above described compounds.

When the light-heat conversion layer is poor in adhesiveness to a support, color mixture due to layer separation in peeling the transfer material from the intermediate image receiving sheet at the time of light irradiation or after heat transfer is likely to occur, therefore, an adhesive layer may be provided between the support and the light-heat conversion layer.

It is essential to select a combination of materials so that the adhesion power between the light-heat conversion layer and the adhesion layer, or between the under layer (the cushion layer) of the support and the adhesion layer is stronger than the ink peeling strength when ink is transferred. A conventional adhesive such as polyester, urethane or gelatin may be used in the adhesive layer. Further, in order to obtain the above effect, a cushion layer may be provided with a tackifying agent or an adhesive, instead of loading the adhesive layer. When the thermoplastic property of the adhesive layer is insufficient, the desired effect derived from thermoplasticity decreases. In that case, the adhesive layer is preferably as thin as possible. The thickness of the adhesive layer is preferably less than 0.5 μm. It is not restricted to this value when the adhesive layer works as a thermoplastic layer.

(B-5) Ink Layer

The ink layer of the ink sheet of the present invention comprises mainly a colorant and a binder. For a laser fusing thermal transfer method, required is a ink layer capable of transferring itself accompanying a colorant, a binder and other substance contained in the layer, which is melted or softened when it is heated. The layer is not necessary to be transferred in a completely fused phase.

The colorant includes inorganic pigments (for example, titanium dioxide, carbon black, graphite, zinc oxide, prussian blue, cadmium sulfate, iron oxide, lead oxide, zinc oxide, and chromate of barium and calcium), organic. pigments (for example, azo compounds, indigo compounds, anthraquinone compounds, anthanthrone compounds, triphenedioxazine compounds, vat dye pigments, phthalocyanine pigments or its derivatives, and quinacridone pigments), and dyes (for example, acidic dyes, direct dyes, dispersion dyes, oil soluble dyes, metal-containing oil soluble dyes and sublimable dyes).

For example, as pigment for a color proof, C.I. 21095 or C.I. 21090 may be used as a yellow pigment, C.I. 15850:1 as a magenta pigment, and C.I. 74160 as a cyan pigment.

The colorant content in the colorant layer may be adjusted in such a manner that an intended content can be obtained based on the intended coating thickness, and is not specifically limited. The colorant content of the colorant layer is ordinarily 5 to 70% by weight, and preferably 10 to 60% by weight.

The binder of the colorant layer includes a heat fusible compound, a heat softening compound, and a thermoplastic resin.

The heat fusible compound is a solid or semi-solid compound having a melting point of 40 to 150° C., the melting point measured by means of a melting point apparatus, Yanagimoto JP-2, and includes waxes, for example, vegetable wax such as carnauba wax, Japan wax, or esparto wax, animal wax such as bees wax, insect wax, shellac wax or spermaceti, petroleum wax such as paraffin wax, microcrystalline wax, polyethylene wax, ester wax or acid wax, and mineral wax such as montan wax, ozocerite or ceresine. Said binder further includes a higher fatty acid such as palmitic acid, stearic acid, margaric acid or behenic acid; a higher alcohol such as palmityl alcohol, stearyl alcohol, behenyl alcohol, margaryl alcohol, myricyl alcohol or eicosanol; a higher fatty acid ester such as cetyl palmitate, myricyl palmitate, cetyl stearate or myricyl stearate, an amide such as acetamide, propionic amide, palmitic amide, stearic amide or amide wax, and a higher amine such as stearyl amine, behenyl amine or palmityl amine.

Said thermoplastic resin includes, for example, an ethylene copolymer, a polyamide resin, a polyester resin, a polyurethane resin, a polyolefin resin, an acryl resin, a polyvinyl chloride resin, a cellulose resin, a rosin resin, a polyvinyl alcohol resin, a polyvinyl acetal resin, an ionomer resin or a petroleum resin, and the resins for the ink binder disclosed in JP-A No. 6-312583. Especially, preferred is a resin having a melting point of 70 to 150° C.

Preferably used besides these thermoplastic resins, may be elastomers such as natural rubber, styrene-butadiene rubber, isoprene rubber, chloroprene rubber or a diene copolymer; rosin derivatives such as an ester rubber, a rosin-maleic acid resin, a rosin phenol resin or a hydrogenated rosin; a phenol resin, terpenes, a cyclopentadiene resin or aromatic hydrocarbon resins.

An ink layer having an intended softening or melting point can be obtained by suitably using the above described heat fusible compound or thermoplastic compound.

Abrasion transfer image formation is possible by employing a binder having a high thermal decomposition property in the present invention. The binder for this purpose is a polymer substance which causes rapid acid catalytic partial decomposition at temperature preferably not more than 200° C. measured in the equilibrium condition. Specific example includes nitrocellulose compounds, polycarbonate compounds, polymers reported in literature (J. Image Science, 30(2), pp 59–64 (1986) by J. M. J. Frechet, F. Bouchard, J. M. Houlihan, B. Kryczke and E. Eichler), polyurethane compounds, polyester compounds, polyorthoester compounds and polyacetal compounds, and copolymers of these.

These polymers are described in detail along with its decomposition mechanism in the above-mentioned literature authored by Houlihan, et al.

It is disclosed in JP A 62-158092 that an image of high density can be obtained by using a uniform grain size pigment. Further, it is effective to employ various dispersion aids for the purpose of obtaining good dispersion property and good color reproduction.

Other examples of said additives include plasticizers which have the effect to obtain higher sensitivity by plasticizing the ink layer, surfactants which improve coating characteristics of the ink layer, fine submicron to micron level particles which prevent blocking of the ink layer.

The thickness of the ink layer is preferably 0.2 to 2.0 $\mu$m, more preferably 0.3 to 0.7 $\mu$m, in the present invention. Specifically, it was confirmed that a high sensitivity can be achieved when the thickness is less than 0.8 $\mu$m.

The transferring property of the ink layer varies according to the kinds and the ratio of the binder or the colorant used. An optimum thickness range is selected by considering the balance of sensitivity, resolution, and other image reproducing properties.

(C) Image Forming Method

One example to execute image formation using the intermediate image receiving sheet of a light-heat conversion mode is explained below.

Firstly, the intermediate image receiving sheet and secondly, the ink sheet are sequentially rolled on an exposure drum and then closely contacted with each other under reduced pressure. A laser beam is irradiated on the back-surface of the ink sheet (on the back coating side) in response to specific image information. The laser beam is absorbed and converted in heat. The converted heat is used to transfer an image from the ink sheet to the intermediate image receiving sheet.

The image formation method of the present invention comprises two processes.

(1) An image transfer process from an image recording material by exposing with a laser beam after closely contacting the intermediate image receiving sheet and the image recording material.

(2) A final image formation process by the following procedures:

- (i) A color image formation on the intermediate image receiving sheet by repeating the above-mentioned process (1),
- (ii) Closely contacting the color image on the intermediate image receiving sheet and a final image forming material and then applying heat or pressure to stick with each other,
- (iii) Transferring the color image and image receiving sheet on the intermediate image receiving sheet to the final image forming material by peeling the intermediate image receiving sheet.

The intermediate image receiving sheet of the present invention can be used for commercially available large format proofing systems, such as Color Decision I, II made by Konica Corporation and FINALPROOF made by Fuji Photo Film Co., Ltd. And the use for these proofing system is preferred.

When the intermediate image receiving sheet of the present invention is used for commercially available large format proofing systems, a transfer process to a final image forming material and a peeling process of the intermediate image receiving sheet are required. And when a printing paper is used for the final image forming material, laminators such as EV-Laminator, EV-Laminator II made by Konica Corporation, or Match Print Laminator 447 made by Imation Ltd can be used for transferring the image. The final image obtained after transferring and peeling the intermediate image receiving sheet has a very similar appearance to a print produced in a production run.

The pressure supplied by a laminator used for the present invention is preferably 0.2 to 10 kg/cm, and is more preferably 1 to 4 kg/cm. When the pressure is less than 1 kg/cm, a sufficient image transfer may not be achieved, and when the pressure is more than 4 kg/cm, a smooth transportation of the paper is likely to be difficult.

The temperature for lamination is preferably 80 to 150° C., and is more preferably 90 to 130° C. When the temperature is less than 80° C. the image transfer is likely to be insufficient. And when the temperature is more than 150° C., the roll for lamination is likely to be deteriorated.

The speed of lamination is preferably 2 to 50 mm/sec, and is more preferably 3 to 30 mm/sec. When the speed of lamination is less than 2 mm/sec, the load to the driving motor becomes excessive and it may prevent a normal transportation and it is not preferred. When the speed of lamination is more than 50 mm/sec, jamming of a thin paper is likely to occur and it is not preferred.

The diameter of the laminator roller is preferably 10 to 300 mm ϕ, and is more preferably 30 to 150 mm ϕ. When the diameter of the laminator roller is less than 10 mm ϕ, temperature unevenness during the image transfer becomes large, and it is not preferred. When the diameter of the laminator roller is more than 300 mm ϕ, the heat capacity becomes large and the required time for heating becomes long, and it is not preferred. It is preferred to use a roller of a high heat conductivity when a large diameter roller is used.

The temperature of the surface of roller of the laminator used for this invention is requested to be highly uniform. Especially, the temperature unevenness in longitudinal direction of the laminator is preferable ±5° C., and is more preferably ±3° C.

In order achieve the evenness of the temperature, a exhaust fan should not be used and an entrance of a fresh air is preferably shielded as much as possible. And the shorter side of the paper which is transferred the image is preferably placed in the longitudinal direction of laminator.

The laser beam light source for recording an image includes a semiconductor laser, a YAG laser, a carbon dioxide gas laser and a helium-neon laser, etc. Of the semiconductor lasers, a single mode laser diode, of which $1/e^2$ diameter is easy to be condensed to a few μm to tens of μm during focusing without major lowering of optical efficiency.

Cited as a usable light source, other than the laser beam light, is a light emission diode (LED). As arrays integrated with plural light emission elements, LED and the semiconductor laser are easily employed.

In the present invention, it is preferable to first record an image first with the laser-melt thermal transfer recording material comprising color, corresponding to said light-heat converting layer, of which absorbance per unit coating weight is established to be the largest. In laser-melt thermal transfer recording, an imagewise laser exposure is carried out by bringing the thermal transfer recording material into close contact with the receiving material (for example, close contact under reduced pressure). When the absorbance per unit coating weight of the light-heat converting layer is excessive, the amount of gas generated during laser exposure (gas generated with or without the existence of ablation) is increased. And as a result, image transfer defects are likely to take place.

In a system in which a final color image is obtained by repeatedly recording monochromatically colored image, it is preferable to transfer the color with the greatest amount of gas genaration. The above-mentioned procedure allows to colsely contact the succesive color sheets, and to achieve a constant sensitivity. Specifically, black color, which absorbs a light of infra-red wavelength, is preferably trasnferred firstly.

As lase scanning methods, conventionally known methods are a cylindrical exterior scanning method, a cylindrical interior scanning method and a flat-bed scanning method. In said cylindrical exterior scanning method, laser exposure is carried out by rotating a drum, around the exterior of which is wound with the thermal transfer image forming material, making the rotation of the drum to be the major scanning process and the movement of the laser beam light to be the sub scanning process. In the cylindrical interior scanning method, the thermal transfer image forming material is fixed on the iterior of a drum and the laser beam light is emitted from the interior, so that the major scanning process is carried out in the direction of circumference by rotating a part or all of the optical system, and the sub scanning process is carried out by moving a part or all of the optical system in a straight line parallel to the axis of the drum. In the flat-bed scanning method, the major scanning of the laser beam light is carried out in combination with a polygonal mirror or a galvano mirror and a fθ lens. And the sub scanning is carried out by moving the thermal transfer image forming material. The cylindrical exterior scanning method and the cylindrical interior scanning method more easily enhance accuracy of the optical system and are more suitable for high density recording.

In the case of multi-channel exposure, using simultaneously plural emmiting elements, the cylindrical exterior scanning method is the most suitable. In cases where a high energy laser source, such as a YAG laser, is employed, it is difficult to achieve a high drum rotational rate with the cylindrical exterior scanning method. Therefore, the cylindrical interior scanning method is most suitable.

EXAMPLE

The invention is described below referring examples, however, embodiments of this invention are not limited thereto.

Example 1

<<Intermediate Image Receiving Sheet (1)>>

Two coating solutions having the following composition were prepared. The "parts" indicated for each component is "part by weight" of the solid ingredient of the material.

<Composition of a Thermoplastic Layer Solution (1)>

| | |
|---|---|
| Vinyl chloride-vinyl acetate copolymer (Solbine CL2, made by Nisshin Kagaku Co.) | 160 parts |
| Ethylene-vinyl acetate copolymer (Elvaloy 742, made by Mitsui Dupont Chemical Co., Ltd.) | 61 parts |
| Sebacate polyester (FN-G25, made by Nihonsoda Co., Ltd.) | 28 parts |
| Salt of perfluoroalkylsufonic acid (Megafac F-113, made by DAINIPPON & CHEMICALS INC.) | 2 parts |
| Salt of perfluoroalkylsufonic acid (Megafac F-178K, made By DAINIPPON & CHEMICALS INC.) | 2 parts |
| Methyl ethyl ketone | 630 parts |
| Toluene | 210 parts |
| Dimethylformamide | 30 parts |

<Composition of a Image Receiving Layer Solution (1)>

| | |
|---|---|
| Butyral resin (BL-SH, made by Sekisui Kagaku Co., Ltd.) | 84 parts |
| Silicone grafted acrylic polymer (X-22-8053, made by Shin-Etsu Chemical Co., Ltd) | 8 parts |
| Salt of perfluoroalkylsufonic acid (Megafac F-176PF, made by DAINIPPON & CHEMICALS INC.) | 0.6 part |
| Methanol | 630 parts |
| Ethanol | 30 parts |

<Preparation of an Intermediate Image Receiving Sheet (1)>

On transparent 130 $\mu$m sheet of polyethylene terephthalate (PET) having (E-68L, manufactured by Torey Co., Ltd.), the above-mentioned thermoplastic layer coating solution (1) was coated by a rotary coater (Whoeler) so that the wet thermoplastic layer thickness was approximately 300 $\mu$m, and then dried in an oven at 100° C, for 2 minutes. Obtained dried thermoplastic layer thickness was 20 $\mu$m.

On that layer was coated the above-mentioned image receiving layer coating solution (1) at a coating rate of 200 rpm and dried in a 100° C. oven for 2 minutes. The dried thickness of the image receiving layer resulting in a 2 $\mu$m coating.

Example 2

<<Intermediate Image Receiving Sheet (2)>>

Thermoplastic layer solution (1) was substituted with thermoplastic layer solution (2), the composition of which is described below, and coated with a wire bar so that the dried coating load was 20 g/m$^2$, and subsequently dried at 100° C. for 2 minutes.

The image receiving layer was coated using the same method as described in Example 1, and resulting in an intermediate image receiving sheet (2).

<Composition of a Thermoplastic Layer Solution (2)>

Polyethylene latex (S3127, made by TOHO CHEMICAL INDUSTRY CO., LTD) 100 parts

Example 3

<<Intermediate Image Receiving Sheet (3)>>

After the coating of a thermoplastic layer using the thermoplastic layer solution (1) in Example 1, a releasing layer solution (1), the composition of which is described below, was applied with a wire bar so that the dried coating load was 3 g/m$^2$, and subsequently dried at 100° C. for 1 minute. Then the image receiving layer solution (1) in Example 1 was coated using the same method as described in Example 1, and resulting in an intermediate image receiving sheet (3).

<Composition of a Releasing Layer Solution (1)>

Polyethylene latex (S7024, made by TOHO CHEMICAL INDUSTRY CO., LTD.) 100 parts

Example 4

<<Intermediate Image Receiving Sheet (4)>>

After coating of a thermoplastic layer using the thermoplastic layer solution (1) in Example 1, a releasing layer solution (2), the composition of which is described below, was applied with a wire bar so that the dried coating load was 3 g/m$^2$, and subsequently dried at 100° C. for 2 minutes. Then the image receiving layer solution (1) in Example 1 was applied using the same method as described in Example 1, and obtained an intermediate image receiving sheet (4).

<composition of a Releasing Layer Solution (2)>

| | |
|---|---|
| Polyvinyl alcohol (NL05, made by Nihon Gosei Kagaku Co., Ltd.) | 5 parts |
| Water purified utilizing an ion exchange resin | 95 parts |

Example 5

<<Intermediate Image Receiving Sheet (5)>>

After coating of a thermoplastic layer using the thermoplastic layer solution (1) in Example 1, a releasing layer solution (3), the composition of which is described below, was applied with a wire bar so that the dried coating load was 3 g/m$^2$, and dried at 100° C. for 1 minute. Then the image receiving layer solution (2), the composition of which is described below, was applied with a wire bar in an amount of 2 g/m$^2$, and then dried at 100° C. for 1 minute to result in an intermediate image receiving sheet (5).

<Composition of a Releasing Layer Solution (3)>

| | |
|---|---|
| Ethylcellulose (Etcell STD10, made by Dow Chemical) | 13 parts |
| Ethyl alcohol, industrial grade | 87 parts |

<Composition of an Image Receiving Layer Solution (2)>

| | |
|---|---|
| Polyacrylic resin latex (Yodosol A5805, resin content 55%, made by Kanebo NSC Co. Ltd.) | 25 parts |
| 25 wt % water dispersion of matting material (MX-40S-2, made by Soken Kagaku Co. Ltd.) | 1.8 parts |
| Fluororesin (Unidyne TG810, made by Daikin Co. Ltd.) | 4.2 parts |
| i-Propylalcohol | 6 parts |
| Water | 60 parts |

<Evaluation>

(1) Peeling Force Measurement (1-a) The image receiving face of the intermediate imaging receiving sheets, prepared in Examples 1–5, were superposed onto the transferring media listed in Table 2, and then were processed under standard transferring conditions of EV-Laminator, manufactured by Konica Corporation.

Obtained samples were cut into 2 cm strips, and said strips were maintained on the peeling jig of a rheometer, to peel the intermediate image receiving sheet from the paper.

The measuring apparatus used was a Rheometer NRM2002J, made by Fudo Co., Ltd., equipped with a peeling jig. The peeling force was measured at a rate of 30 cm/min.

(1-b) The peeling force between the image receiving layer and the lower layer of the intermediate image receiving sheet, was also measured with the same apparatus. At first, a piece of adhesive tape, made by Nichiban Co., Ltd., was adhered onto the image receiving layer face of the intermediate image receiving sheet. And then it was peeled at 180 degree.

(1-c) The paper peeling-damage property was tested by repeating the peeling the intermediate image receiving sheet from the paper. The evaluation was done according to the following standards and the results are shown in Table 1.

A: no peeling-damage after 10 times of peeling tests

B: 1 time of peeling-damage after 10 times of peeling tests

C: 2 times of peeling-damage after lo times of peeling test

D: 5 times of peeling-damage after 10 times of peeling test

E: 10 times of peeling-damage after 10 times of peeling test (2) Glossiness of Art Paper After exposure by said laser beam light, the recorded image on the ink sheet was transferred onto the intermediate image receiving sheet, and then the image was transferred to Tokubishi art paper (thickness and Bekk smoothness of paper are indicated in Table 2). The differences of glossiness between the paper, the image transferred part of the paper, and the non-image transferred part of the paper were noted. The evaluation was done according the following standards and the results are shown in Table 1.

Glossiness was measured at 60–60 degrees. The measurement was in accordance with JIS.

A: The glossiness difference between the paper and both image transferred portion and non-image transferred portion is less than 10.

B: The glossiness difference between the paper and either image transferred portion or non-image transferred portion is more than 10.

C: The glossiness difference between the paper and both image transferred portion and non-image transferred portion is more than 10.

(3) Surface Resistance

The images for evaluating the intermediate imaging receiving sheets prepared in Examples 1–5 were formed by using Konica Color Decision transfer film (CD-2 YMCK) using EV-Laser Proofer. Any scratches formed just after the image formation were visually evaluated. Then the final images were transferred from the intermediate imaging receiving sheets onto a Tokubishi art paper by inserting it into the receiving tray of said EV-Laminator.

Any increase in the number of scratches on the transferred image after this procedure were visually evaluated according to the following criteria.

A: no increase in the number of scratches

B: an increase in the number of scratches in a few portion of the images.

C: an increase in the number of scratches in all portion of the images.

TABLE 2

| | Brand name | Maker | Paper weight ($g/m^2$) | Bekk smoothness (sec) |
|---|---|---|---|---|
| Art paper | Tokubishi art | Mitsubishi Paper Mills Ltd. | 127.9 | 106.3 |
| Matt paper (1) | New-age | Oji Paper Co., Ltd. | 127.9 | 8.8 |
| Matt paper (2) | Silver Daia | Nippon Paper Industries | 127.9 | 6.3 |
| Fine-quality paper | NPI high quality | Nippon Paper Industries | 127.9 | 3.9 |

The physical properties of the layers in the intermediate imaging receiving sheets prepared in Examples 1–5 were measured and the results are listed in Table 3.

The measuring conditions are as follows.

TMA measuring apparatus: Thermo Flex (made by Rigaku Corporation)

Measurement temperature: 25 to 200° C.

Rate of temperature rise: 5° C./min

TMA softening point was determined by observing the starting point of the phase change while loading a weight of 10 g on a 1 mm φ quartz pin.

The polymer solubility parameter determining method, proposed by Mr. Okitsu of Konishi Corporation, was adopted to calculate SP values.

TABLE 3

| Intermediate image receiving sheet | TMA softening point: Thermoplastic layer | TMA softening point: Releasing layer | Calculated SP value: Image receiving layer | Calculated SP value: Under layer |
|---|---|---|---|---|
| (1) Reference | 60 | — | 9.9 | 10.4 |
| (2) Invention | 65 | — | 9.9 | 7.9 |
| (3) Invention | 60 | 65 | 9.9 | 7.9 |
| (4) Invention | 60 | 120 | 9.9 | 12.6 |
| (5) Invention | 60 | 150 | 8.9 | 10.3 |

The results shown in Table 1 demonstrate that the samples of the present invention have fairly better properties compared to reference sample (1) in the evaluation characteristics of paper peeling-damage, glossiness of said art paper, and surface resistance.

TABLE 1

| Intermediate image receiving sheet | (1-b) Peeling force before being laminated with paper (g/cm) | (1-a) Peeling force after being laminated with paper (g/cm) (25° C. 50%): Matt paper 1 | Matt paper 2 | Fine-quality paper | (1-c) Paper peeling-damage: Matt paper 1 | Matt paper 2 | Fine-quality paper | (2) Glossiness of art paper | (2) Surface resistance |
|---|---|---|---|---|---|---|---|---|---|
| (1) Reference | more than 10 g | 100 | 120 | 2000 | B | E | E | C | A |
| (2) | more than 10 g | 20 | 25 | 40 | A | A | A | B | A |
| (3) | more than 10 g | 20 | 25 | 40 | A | A | A | B | A |
| (4) | 3 g | 1.5 | 1.5 | 2 | A | A | A | A | B |
| (5) | more than 10 g | 9 | 9 | 10 | A | A | A | A | A |

The present invention is capable of providing an intermediate image receiving sheet for a thermal transfer recording method which has excellent properties of paper peeling-damage, glossiness of said art paper, and surface resistance.

Disclosed embodiment can be varied by a skilled person without departing from the spirit and scope of the invention.

What is claimed is:

1. An intermediate image receiving sheet, comprising:

(i) a support (ii) a thermoplastic layer which is capable of being thermally softened;

(iii) an image receiving layer which is capable of receiving an image from an image recording material; and (iv) a releasing layer which is provided between the thermoplastic layer and the image receiving layer, and is capable of reducing the force necessary to peel the image receiving layer from the releasing layer when the image receiving layer is transferred to a final image forming material;

wherein the intermediate image receiving sheet is capable of transferring the image and the image receiving layer to the final image forming material by a process of applying heat or pressure to the intermediate image receiving sheet, and the force to peel the image receiving layer transferred to the final image recording material from the releasing layer is 1 to 100 g/cm, the force being measured with a material whose Bekk smoothness is 0 to 15 seconds at 25° C. and RH 50%, defined by JIS P8119.

2. The intermediate image receiving sheet of claim 1, wherein the force is 10 to 100 g/cm.

3. The intermediate image receiving sheet of claim 2, wherein the force is 10 to 50 g/cm.

4. The intermediate image receiving sheet of claim 1, wherein the image receiving layer contains a butyral resin in an amount of not less than 50% by weight of the image receiving layer, and the thermoplastic layer contains a polyolefin resin in an amount of not less than 50% by weight of the thermoplastic layer.

5. The intermediate image receiving sheet of claim 1, wherein the releasing layer contains a binder resin in an amount of not less than 50% by weight of the releasing layer, and the binder resin in the releasing layer has a different SP value of 1 to 20 from that of a binder resin used in the image receiving layer.

6. The intermediate image receiving sheet of claim 1, wherein the thermoplastic layer contains a binder resin in an amount of not less than 50% by weight of the thermoplastic layer, and the binder resin meeting the following requirements:

(i) a TMA softening point of 30 to 100° C., (ii) a melting point of 80 to 150° C., (iii) a difference between the melting point and the TMA softening point of less than 50° C.

7. The intermediate image receiving sheet of claim 1, wherein the releasing layer contains a binder resin in an amount of not less than 50% by weight of the releasing layer, and having a TMA softening point of the binder resin of 120 to 300° C.

8. The intermediate image receiving sheet of claim 1, wherein a thickness of the releasing layer is 0.3 to 6.0 μm.

9. The intermediate image receiving sheet of claim 1, wherein a thickness of the image receiving layer is 0.1 to 3.0 μm.

10. The intermediate image receiving sheet of claim 9, wherein a thickness of the image receiving layer is 0.2 to 2.5 μm.

11. The intermediate image receiving sheet of claim 1, wherein a thickness of the image receiving layer is 0.5 to 10.0 μm.

12. The intermediate image receiving sheet of claim 11, wherein a thickness of the image receiving layer is 0.8 to 8.0 μM.

* * * * *